United States Patent [19]

Motojima et al.

[11] Patent Number: 4,996,578
[45] Date of Patent: Feb. 26, 1991

[54] SEMICONDUCTOR DEVICE

[75] Inventors: Hideaki Motojima; Keiji Kamasaki, both of Yokohama, Japan

[73] Assignee: Kabushiki Kaisha Toshiba, Kawasaki, Japan

[21] Appl. No.: 288,182

[22] Filed: Dec. 22, 1988

[51] Int. Cl.$^5$ ............................................. H01L 27/14
[52] U.S. Cl. ........................................ 357/30; 357/40; 357/48; 357/53; 357/59; 357/68
[58] Field of Search ...................... 357/30, 40, 48, 53, 357/59, 68

[56] References Cited

U.S. PATENT DOCUMENTS 4,291,326  9/1981  Higuchi et al. ........................ 357/30

Primary Examiner—Edward J. Wojciechowicz
Attorney, Agent, or Firm—Finnegan, Henderson, Farabow, Garrett, and Dunner

[57] ABSTRACT

A semiconductor device includes a photodetector for converting an optical signal into an electric signal, and a semiconductor element comprising an optical transmissible conductive film formed through an insulating film on the main surface of a semiconductor with a photodetector, and electrically connected to a constant potential line of the semiconductor device, a wiring layer formed through an insulating film on the main surface of the semiconductor formed with the semiconductor element, an insulating film formed over the wiring layer, and an optical shielding film formed on part or whole of the semiconductor element except the photodetector on the insulating film.

4 Claims, 3 Drawing Sheets

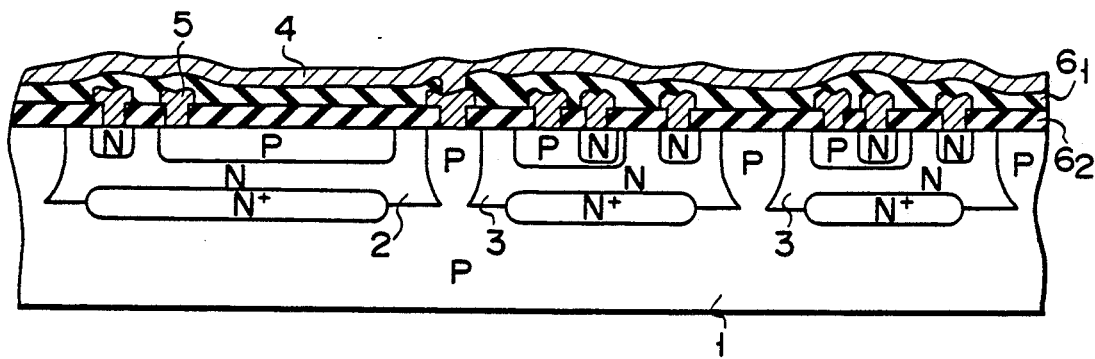
F I G. 1
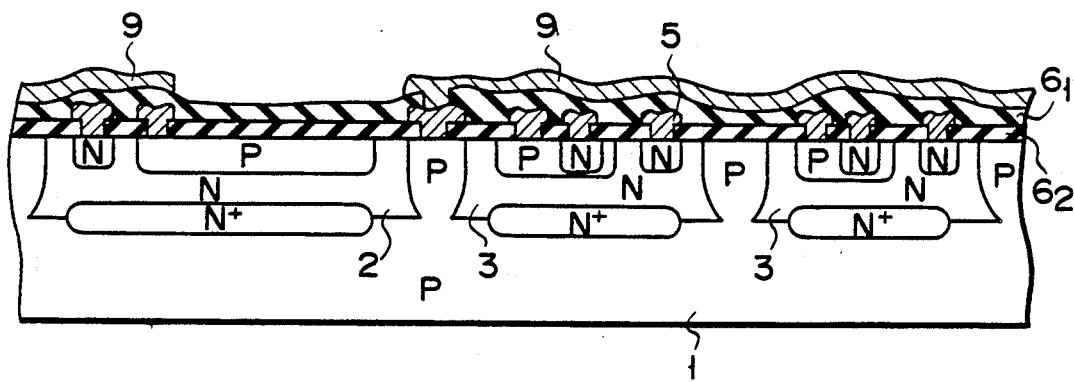
F I G. 2

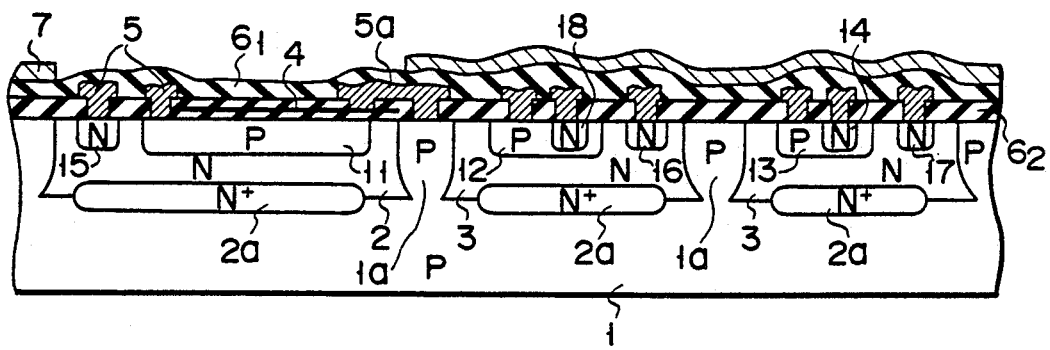
F I G. 3
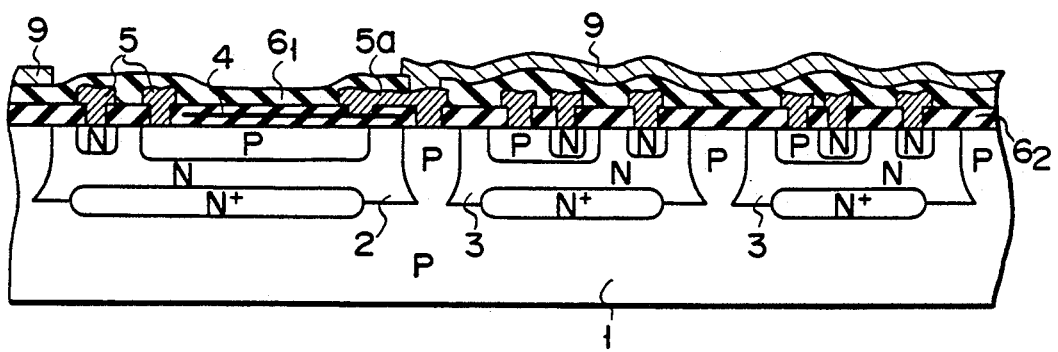
F I G. 4
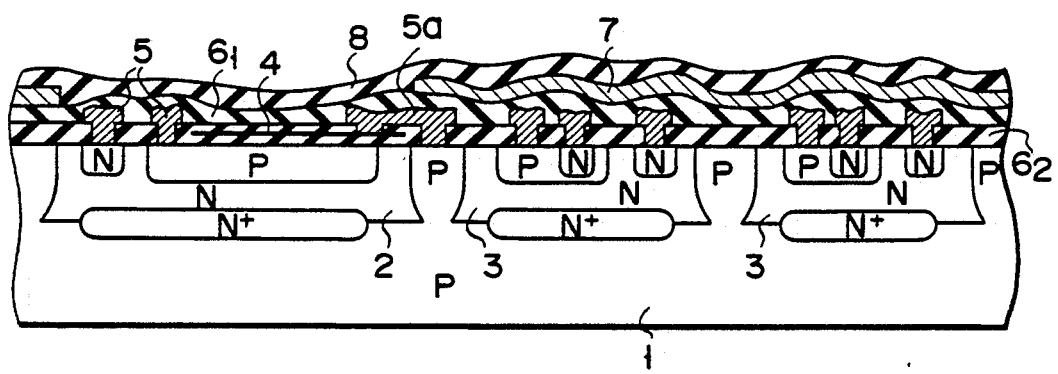
F I G. 5

SEMICONDUCTOR DEVICE

BACKGROUND OF THE INVENTION

1. Field of the Invention

The present invention relates to a semiconductor device which operates by a light.

2. Description of the Related Art

Recently, semiconductor devices which operate by an optical signal as an input signal - monolithic integration of elements for converting light into a current, such as photodiodes, phototransistors, amplifiers, waveform shapers, etc. has advanced, and the application fields of these semiconductor devices has increased. However, their available environments have been gradually deteriorating. Numerous electromagnetic waves are radiated in the air, and surge voltages generated upon opening and closing power sources are always imparted to power lines. Heretofore, on-chip shields for covering semiconductor chips through insulating films with conductive films have been formed as a means of preventing semiconductor devices from erroneously operating due to electromagnetic waves and surge voltages. In the semiconductor devices which operate by inputting light as input signal, a shielding film has to have transparency and conductivity. Thus, optical transmissible conductive films made of tin oxide, indium oxide or polysilicon are used. FIG. 1 is a sectional view showing this conventional semiconductor device. Reference numeral 1 denotes a semiconductor substrate; 2, a photodetector for forming a photodiode; 3, a semiconductor element; 4, an optically transmissible conductive film; 5, metal wirings; and 61, 62, insulating films.

In semiconductor devices in which elements for converting light into a current, such as photodiodes, phototransistors, amplifiers, and waveform shapers are monolithically integrated, problems such as erroneous operations of elements by light irradiated towards the elements other than those elements for converting light into a current, frequently occur. Thus, as shown in FIG. 2, optical shielding materials 9 for shielding light, made of aluminum films or aluminum silicon films are formed on elements other than the elements for converting an optical signal into an electric signal.

The shield of optical transmissible conductive film 4 shown in FIG. 1 results in a selective shielding effect. However, light as an input signal is irradiated over the whole chip surface. Thus, an optical signal is converted into an electric signal even by the element other than the elements intended to convert the optical signal into the electric signal, such as photodiodes, phototransistors thereby causing an erroneous operation to occur.

Optical shielding materials 9 of elements other than the elements for converting an optical signal into an electric signal, to prevent an erroneous operation give a misleading breakdown strength against electromagnetic waves and/or surge voltages, such as the breakdown strength against a noise contained in a momentary electromagnetic wave like 10000 V/microsecond to eliminate an erroneous operation, i.e., shielding effect. This is considered because the photodiodes and phototransistors are the most sensitive among the chips.

SUMMARY OF THE INVENTION

Accordingly, the object of the present invention is to provide a semiconductor device which prevents erroneous operation by light, to provide high reliability with a sufficient shielding effect maintained over the most sensitive elements.

According to the present invention, there is provided a semiconductor device having a photodetector for converting an optical signal into an electric signal, and a semiconductor element comprising an optical transmissible conductive film formed through an insulating film on the main surface of a semiconductor with a photodetector, and electrically connected to a constant potential line of the semiconductor device, a wiring layer formed through an insulating film on the main surface of the semiconductor formed with the semiconductor element, an insulating film formed over the wiring layer, and an optical shielding film formed on part or whole of the semiconductor element except the photodetector on the insulating film. More specifically, in the semiconductor of the present invention, the elements for converting an optical signal into an electric signal, such as photodiodes, phototransistors are shielded by the optical transmissible conductive films, and the other elements are optically shielded by optical shielding films or optically shielding conductive films.

According to the present invention, an erroneous operation by the irradiation of a light on the elements other than the photodetectors can be sufficiently eliminated while the shielding effect of the photodetectors is significantly maintained. Further, when this invention is used as a photodetector, such as a photocoupler, an erroneous operation due to a displacement current can be prevented even if an electric noise dv/dt is applied thereto. This invention does not need any novel step, and can perform the semiconductor device in combination of the conventional steps.

BRIEF DESCRIPTION OF THE DRAWINGS

FIGS. 1 and 2 are sectional views of a conventional semiconductor device;

FIG. 3 is a sectional view of an embodiment of a semiconductor device according to the present invention;

FIG. 4 is a sectional view of another embodiment of a semiconductor device according to the invention;

FIG. 5 is a sectional view of still another embodiment of a semiconductor device of the invention;

DETAILED DESCRIPTION OF THE PREFERRED EMBODIMENTS

Figure 6:
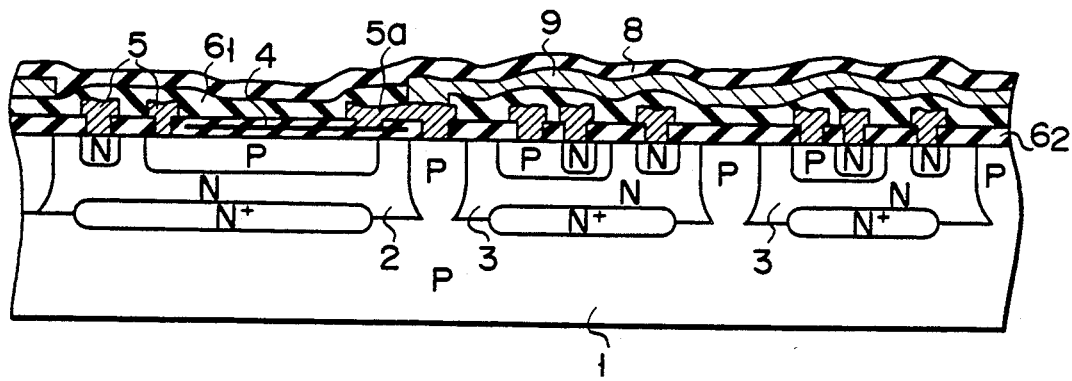
FIG. 6 is a sectional view of yet another embodiment of a semiconductor device of the invention.

Embodiments of the present invention will now be described in detail with reference to the accompanying drawings.

FIG. 3 is a sectional view of an embodiment of the present invention, wherein the same reference numerals as those in FIGS. 1 and 2 denote equivalent or corresponding parts or components. As shown in FIG. 3, an ordinary semiconductor manufacturing process comprises the steps of forming semiconductor elements 2, 3 on semiconductor substrate 1, and forming optical transmissible conductive film 4 made, for example, of polysilicon, indium oxide or tin oxide in insulating film (optical transmissible) on photodiode 2. Metal wirings 5 are formed to obtain predetermined circuit functions.

Then, elements made of silicon oxide, polyimide or nitride silicon are covered with a suitable insulating film (optical transmissible) $6_1$, insulating film $6_1$ is covered with optical shielding film (which may be insulative) 7 made of aluminum or aluminum alloy, and photodiode 2 is left uncovered. In this arrangement, wirings 5a are so formed on optical transmissible conductive film 4 as to electrically connect to a substrate of a constant potential line of the semiconductor device, such as a ground potential, thereby bypassing noise.

In another embodiment shown in FIG. 4, optically shielding film 9 has conductivity similarly to optically shielding film 7 in FIG. 3. Film 7 is contacted with optical transmissible conductive film 4 and connected to a constant potential line together with optical transmissible conductive film 4, thereby further improving its shielding effect. Even if passivation film 8 made, for example, of oxide silicon, polyimide or silicon nitride is formed on optical shielding film 7 or optical shielding conductive film 9 as shown in FIGS. 5 and 6, the shielding effect of this invention is not affected.

Figure 7:
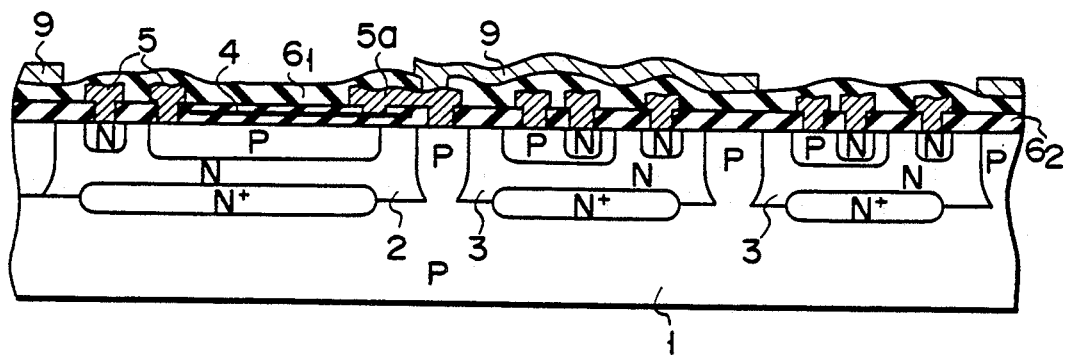
FIG. 7 is a sectional view of still another embodiment of a semiconductor device of the invention.

Optical shielding film 9 is not necessarily formed on all elements other than photodiode 2 as shown in FIG. 7, but may be formed only on elements which could cause an erroneous operation.

Figure 8:
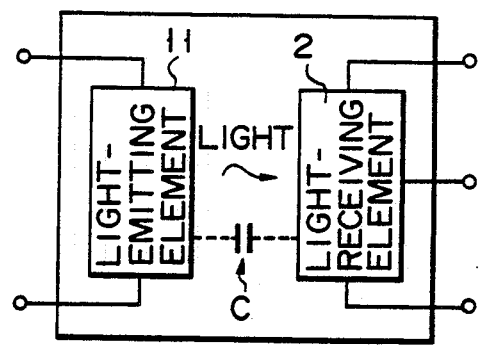
FIG. 8 is a view of an arrangement in the case of the semiconductor device of the invention being applied to a photocoupler.

An example in which this invention is applied to a photodetector, such as a photocoupler, is shown in FIG. 8. In FIG. 8, reference numeral 11 denotes a light emitting element; and C, a parasitic capacity.

According to the present invention, an erroneous operation due to the irradiation of a light to elements other than the photodiode can be completely eliminated while sufficiently maintaining the breakdown strength against external noise. This invention does not need a novel step, but can manufacture a semiconductor device having a high shielding effect, with a in combination of conventional steps. A significant effect is also obtained by applying this invention to a photodetector, such as a photocoupler. The photocoupler is of an element for transmitting an electric signal as a medium of a light as shown in FIG. 8, and comprises light emitting element 11, and photodetector 2. Since light emitting element 11 is electrically insulated from photodetector 2, they are capacitively coupled by capacitor C. When an electric noise dv/dt, having an abrupt rise, is applied between light emitting element 11 and photodetector 2, displacement current C dv/dt is generated from capacitive coupling C to cause an erroneous operation. A light is irradiated from light emitting element 11 to photodetector 2 when the photocoupler is operated, but the light is irradiated to elements other than photodetector 2 to cause an erroneous operation. However, the generated displacement current is bypassed (shielded) by optical transmissible conductive film 4 by using the photodetector of this invention to shield the elements other than the photodetector, thereby preventing an erroneous operation from occurring.

What is claimed is:

1. A semiconductor device including a photodetector and semiconductor elements in a semiconductor substrate, wherein said photodetector is formed on a first surface of said semiconductor substrate and converts an optical signal into an electrical signal, and said semiconductor elements are formed in a second surface of said semiconductor substrate and receive and process said electrical signal, said semiconductor device further comprising:

a first insulating film having optical transmissibility formed on said first and second surfaces of said substrate;

an optical transmissible conductive film buried in a portion of said first insulating film and electrically connected to a constant potential line of said substrate, said portion being positioned on said photodetector;

a wiring layer for connecting said optical transmissible conductive film to said substrate;

a second insulating film formed on said first insulating film and having optical transmissibility; and an optical shielding film formed on a portion of said second insulating film, said portion being positioned over said semiconductor elements.

2. The semiconductor device according to claim 1, wherein said optical shielding film is conductive and electrically connected to the constant potential line of said semiconductor substrate similarly to said optical transmissible conductive film.

3. The semiconductor device according to any of claims 1 or 2, wherein said optically transmissible conductive film is made of polysilicon and said optical shielding film is made of aluminum metal.

4. The semiconductor device according to any of claims 1 or 2, wherein said photodetector and said semiconductor elements comprise a photocoupler.

* * * * *